(12) United States Patent
Vandenbrande

(10) Patent No.: US 8,835,797 B2
(45) Date of Patent: Sep. 16, 2014

(54) METHOD AND DEVICE FOR THE PLASMA TREATMENT OF RUNNING METAL SUBSTRATES

(75) Inventor: Pierre Vandenbrande, Löhningen (CH)

(73) Assignee: Advanced Galvanisation AG, Neuhausen (CH)

( * ) Notice: Subject to any disclaimer, the term of this patent is extended or adjusted under 35 U.S.C. 154(b) by 125 days.

(21) Appl. No.: 12/739,305

(22) PCT Filed: Oct. 6, 2008

(86) PCT No.: PCT/EP2008/063354
§ 371 (c)(1),
(2), (4) Date: Apr. 22, 2010

(87) PCT Pub. No.: WO2009/053235
PCT Pub. Date: Apr. 30, 2009

(65) Prior Publication Data
US 2010/0308022 A1 Dec. 9, 2010

(30) Foreign Application Priority Data
Oct. 22, 2007 (EP) .................................... 07119011

(51) Int. Cl.
*B23K 10/00* (2006.01)
*H01J 37/32* (2006.01)

(52) U.S. Cl.
CPC ......... *H01J 37/321* (2013.01); *H01J 37/32697* (2013.01); *H01J 37/32623* (2013.01); *H01J 37/32761* (2013.01)
USPC ............ 219/121.59; 219/121.41; 219/121.36; 219/121.81

(58) Field of Classification Search
USPC ...................... 219/121.36, 43, 45, 51, 52, 59
See application file for complete search history.

(56) References Cited

U.S. PATENT DOCUMENTS

| | | | |
|---|---|---|---|
| 5,534,231 A * | 7/1996 | Savas ............................... 216/67 |
| 6,097,157 A * | 8/2000 | Overzet et al. ............ 315/111.21 |
| 6,101,971 A * | 8/2000 | Denholm et al. .......... 118/723 E |
| 6,143,129 A * | 11/2000 | Savas et al. .............. 156/345.48 |
| 6,245,202 B1 * | 6/2001 | Edamura et al. ......... 204/298.06 |
| 2001/0042827 A1 * | 11/2001 | Fang et al. ...................... 250/283 |
| 2002/0023899 A1 * | 2/2002 | Khater et al. ............. 219/121.41 |
| 2002/0029747 A1 * | 3/2002 | Powell et al. ............. 118/723 IR |
| 2002/0092618 A1 * | 7/2002 | Collins .................... 156/345.48 |

(Continued)

FOREIGN PATENT DOCUMENTS

EP 1020892 A1 7/2000
JP 2003-203869 * 7/2003

(Continued)

*Primary Examiner* — Minh-Loan T Tran
*Assistant Examiner* — Fazli Erdem
(74) *Attorney, Agent, or Firm* — Browdy and Neimark, PLLC

(57) ABSTRACT

The invention relates to a method and a device for the plasma treatment of metal substrates or insulating substrates (3) running substantially continuously through a vacuum chamber having a treatment zone (2), the plasma being sustained by radiofrequency inductive coupling in the treatment zone (2) by means of an inductor (4) connected to a radiofrequency generator, in which the inductor (4) is protected from any contamination by the material emitted by the surface of the substrates (3) by means of a Faraday cage (7), which is positioned between the plasma and the inductor (4), and in which the Faraday cage (7) is on average electrically biassed positively with respect to the substrates (3) or with respect to a counter-electrode present in the plasma.

29 Claims, 4 Drawing Sheets

(56) References Cited

U.S. PATENT DOCUMENTS

2002/0170678 A1* 11/2002 Hayashi et al. .......... 156/345.48
2003/0159782 A1    8/2003 Brcka
2004/0194890 A1* 10/2004 Moroz ..................... 156/345.48
2012/0279659 A1* 11/2012 Dhindsa ................... 156/345.44

FOREIGN PATENT DOCUMENTS

| WO | 0175930 A1 | 10/2001 |
| WO | 0212591 A1 | 2/2002 |
| WO | 02084699 A1 | 10/2002 |

* cited by examiner

METHOD AND DEVICE FOR THE PLASMA TREATMENT OF RUNNING METAL SUBSTRATES

The invention relates to a method for the plasma treatment, in particular cleaning and/or heating in mass production, of metal substrates or insulating substrates, in the form of wires, girders, tubes, plates, profiles, all types of transverse sections, strips and/or sheets, but also parts disposed on supports, for example metal hooks or baskets, transported in a treatment area by means of devices generally of any kind, such as a bank of rollers or a monorail transport system.

In this method, the substrate to be treated is moved in a given direction in a vacuum chamber having a treatment area in which an electrical discharge is created between an electrode and a substrate, close to the surface of the latter, by means of a device that is also the subject matter of the invention.

The method and device according to the invention make it possible in particular to eliminate a contamination layer on the substrate, such as a surface metal oxide and surface carbon, so as to promote the adhesion of a coating applied subsequently by a vacuum deposition technique.

The invention also makes it possible to effectively heat the substrate and can consequently serve for annealing metal products or ensuring the formation of surface compounds by diffusion or reaction with the substrate when reactive substances are added in the form of gas at a pressure below 1000 mbar in the treatment area. The method according to the invention is applicable to any substrate that is sufficiently electrically conductive and therefore applicable equally well to substrates made from soft steel, stainless steel, aluminium, copper and other metals, but also to electrically conductive substrates coated with a thin electrically insulating layer and, in a particular embodiment of the invention, to insulating substrates, although it has been developed essentially for an industrial application aimed at the pre-treatment of soft steels before galvanising by vacuum deposition method. It is this great flexibility of application that confers on this novel method a considerable advantage compared with the treatment methods used up until now in particular aimed at the treatment of steel products. This is because, as will be explained below in more detail, this method makes it possible, for example, to treat the surfaces, not only open but also partially closed, of products with any forms of cross section provided that the plasma generated by the novel device can diffuse to these surfaces. This method, through its particular excitation device, is much less sensitive to the formation of electric arcs than the methods of the prior art that are based on heating of the plasma by generation of secondary electrons. Finally, this novel method also makes it possible, through an alternating or pulsed excitation of an electrode facing the product to be treated, to treat metal surfaces covered with electrically insulating substances, such as steel sheets, profiles or girders coated with a paint that does not conduct electric current, for example.

PRIOR ART

The methods known up until now for cleaning or heating a metal product by plasma have several disadvantages:
  They make it possible to treat only metal surfaces, at most covered with a layer of metal oxide a few nanometres thick, and do not therefore make it possible to clean very highly oxidised products or those coated with polymers;
  These methods known from the prior art, based exclusively on the generation of a plasma by the emission of secondary electrons, are extremely propitious to the formation of electric arcs, which may make decontamination of the substrate very difficult, or even impossible, and even lead to an irremediable degradation of the surface of the latter by the formation of surface fusion points by dissipation of the energy of the arcs produced.

The prior art allows only the treatment of metal substrates with simple geometric shapes, essentially longitudinal substrates with highly open surfaces passing right through the treatment devices. According to the prior art, prior to the invention described in WO 02/12591, it was for example not possible to treat, in a single operation, all the external faces of a metal product, making it impossible to treat girders, tubes and profiles, for example, but also greatly complicating the treatment of sheets because of the variations in width of strips and the inevitable lateral movements of these in a continuously moving line particular to the metalworking industry and in particular for the treatment of steel sheets. This is because the existing methods involve the creation, on the surface of the substrate, of a magnetron discharge by disposing arrays of magnets at the rear of the surface to be treated. This obviously limited this technology to the treatment of relatively thin sheets and strips in order to obtain a sufficiently intense magnetic field to allow the formation of a plasma by magnetron discharge in the vicinity of the surface opposite to the one behind which the arrays of magnets were disposed. This is particularly the case with soft steel sheets, which must also be saturated by the magnetic induction field. The device described in WO 02/12591, using at least one magnetic mirror that a longitudinal product must pass over, resolves this difficult but also has major drawbacks for a good number of practical applications. This is because, though this device allows the treatment of elongate products of any shapes, such as girders with practically all cross sections, profiles, thin or thick sheets, tubes, wires, etc, in practice it again has certain drawbacks for the treatment of the ends of products that are long and which therefore do not pass right through the treatment device. In this case, the magnetron discharge zone at the surface of the product to be treated, limited to the length of the substrate in the treatment area, may prove to be insufficient to form a stable plasma because of an axial confinement of the plasma that is insufficient in the direction of the magnetic mirror that the product does not pass over. To overcome this problem, a simple means consists, during the treatment of the ends, of increasing the useful electric power in order to maintain the density of the plasma by increasing the ionisation rate, so as to compensate for the losses of plasma by axial ambipolar diffusion in the direction of the minor that the product does not pass over. This does however greatly complicate the management of the system. Another drawback of this device is that it is only with difficulty that it allows the treatment of products having greatly closed internal surfaces. Thus, for example, this device allows the treatment of the entire surface of U-shaped, T-shaped or I-shaped girders, but presents more difficultly with the treatment of the internal surface of a partially closed U or a pipe split along its axis. Another drawback of this device relates to the fact that the electrical characteristics of the plasma depend essentially on the geometric and surface characteristics of the substrate, which may create instabilities during the treatment in parallel of several substrates, such as for example girders passing in parallel in the treatment area. In this case, the discharge is liable not to form on all the substrates placed in parallel in the treatment area since the plasma forms preferentially in the areas of less impedance and certain products might not be treated. Another drawback also occurs when a substrate is covered on certain areas with an electrically insulating material preventing the axial symmetry necessary to the functioning of the magnetron discharge described in WO 02/12591, and treatment of the part is then impossible. A frequent drawback in practice of the devices and methods known up until now presents itself when the substrate is highly contaminated with a metal oxide. In this case, the impossibility of independently controlling the flow of ions to the substrate and the discharge voltage promotes the formation of electric arcs, which greatly limits the useful power density, which may make it impossible to decontaminate a substrate without risk of damaging its surface with arc spots.

GENERAL DESCRIPTION OF THE INVENTION

The proposed method and device according to the invention aim to solve these drawbacks by the following means:

The heating of the plasma is no longer dependent on the emission of secondary electrons but is fundamentally ohmic and stochastic by radio-frequency (RF) inductive coupling of electromagnetic energy, which makes possible the treatment of substrates that are very highly contaminated, or even covered on the surface with electrically insulating materials, and of varied shapes. It is for example possible to treat the ends of long substrates, substrates that are not necessarily elongate or the internal surfaces of highly closed substrates.

In the principal embodiment of the invention, the counter-electrode/substrate system, which no longer acts in the creation of the plasma, affords independent control of the potential difference in acceleration of the ions towards the substrate and their flow on the substrate. This is because the flow of ions depends only on the plasma density and is directly proportional to the coupled RF power in the discharge.

RF inductive coupling is a relatively simple, and moreover known, means for creating a high-density plasma at a given power, by comparison with a capacitive coupling for which the major part of the RF power is used in the acceleration of the ions in the sheaths. RF inductive coupling is generally applied by means of an inductor solenoid placed outside a vacuum chamber formed from a dielectric material (ceramic, glass or quartz) to allow the transmission of the electromagnetic energy. In industrial treatment plants of the type referred to by the invention, which relate to the treatment of beams and steel sheets, for example, the size of the vacuum chambers is such that the forces that would be generated by the external atmospheric pressure would make it extremely complex, or even hazardous, to construct part of the vacuum chamber of this size from dielectric materials. This is because, for dimensions exceeding one metre, mechanically welded constructions, made from steel or aluminium, provided with stiffeners, are inevitable. This mechanical constraint makes it necessary to place the inductor inside the vacuum chamber, which involves difficulties of an electrical nature for which the invention affords solutions.

The decontamination treatment of metal parts, following the ion bombardment of the surfaces of these, produces a high emission of atoms coming from the contamination layer removed, from which it is necessary to protect the inductor, which must preserve as small a surface resistance as possible, in order to minimise losses by Joule effect. The inductor is for example formed by a solenoid. In general, the inductor is made from copper and is advantageously coated on its surface with a deposit of silver in order to reduce its surface resistance as far as possible since the RF current flows essentially on the surface of the inductor.

The protection of the coupling surface of the inductor from any contamination by the material emitted by the decontaminated surface, such as for example iron, is ensured, according to the invention, by means of a Faraday screen disposed in its vicinity with a shape similar to that of the inductor, the design of which allows not only total protection of this active face of the inductor but also optimum transmission of the RF electromagnetic power in the treatment area.

In a particularly advantageous configuration, the Faraday screen is formed by a metal structure disposed inside an inductor solenoid, and has a series of slots parallel to one another and perpendicular to the direction of flow of the inducing current travelling through the solenoid. Each slot is protected by a metal longitudinal member secured to the Faraday screen and placed on the same side as the treatment area in line with the slot at a small distance from the latter in order not to short-circuit the electrical capacitance created by the slot. A longitudinal member is therefore situated facing each slot in the Faraday screen, so as to prevent the contamination from reaching the surface of the solenoid through these slots.

The Faraday screen and the longitudinal members protecting the longitudinal slots are assembled by means of two flanges preferably situated outside the area of influence of the inductor. The flanges are advantageously cooled with water. These flanges must preferably be outside the area of influence of the inducing solenoid and are actually so when the Faraday screen has sufficiently great length so that they are situated outside the solenoid and sufficiently far away from the ends of the latter in order not to be the seat of induced currents. It is advantageously possibly to combine with this measure generally one, and sometimes several, insulating sections in the support flanges of the Faraday screen, so that the latter do not constitute a closed electrical circuit, which further reduces the level of the current induced in the Faraday screen.

Only simulations make it possible to determine the optimum arrangement of the longitudinal slots, the position of the flanges with respect to the inductor and the number of insulating sections to be provided per flange. The optimum arrangement is the one that leads to maximum transmission of the electromagnetic power radiated by the inductor through the Faraday screen.

The Faraday screen is, according to the invention, electrically polarised, positively on average over time with respect to the substrate or to an electrode facing it, in order to constitute an electrode directed towards the substrate or substrates to be treated and to allow the coupling of the power necessary for treatment thereof.

This electrode consequently constitutes, according to the invention, the aforementioned Faraday screen and makes it possible to accumulate on its surface, without impairment of the substrate treatment conditions, the contamination layer removed from the treated substrates.

In the device according to the invention, the Faraday screen consequently constitutes a conductive electrode adjacent to the plasma, in particular in contact with the plasma, which is polarised on average positively with respect to a counter-electrode or with respect to the substrate to be treated, The purpose of the Faraday screen, which therefore mainly forms an anode, is to recover the electrodes from the plasma and thus closes an electrical circuit on the plasma which is created by another means. This other means is preferably a radio-frequency inductive electromagnetic excitation through the Faraday screen. The latter thus accelerates the ions present in the plasma towards a counter-electrode which is, for example, formed by the substrate to be treated.

The plasma is generated in the intermediate space between two electrodes, either between the Faraday screen and the substrates in the treatment area, or between the Faraday screen and a counter-electrode.

It is crucial to prevent the formation of any stray plasma between the electrode, forming the Faraday screen, and the inductor. For this purpose it is necessary to limit the free spaces between this electrode and the inductor to dimensions less than the thickness of the sheath that could form between these surfaces and any plasma. The thickness of this sheath is typically less than, or around, 1 mm.

Moreover, it also necessary, in order to increase the capacitive reactance between the inductor and the electrode forming the Faraday screen, in order to limit the capacitive coupling, but also for construction reasons, to maintain a separation of at least several millimetres between these surfaces. To this end, generally a distance of 1 to 10 cm must be maintained between the Faraday screen and the inductor.

In order to comply with these two conditions, the invention provides for the placing of an intermediate dielectric material in the space separating the inductor from the electrode forming the Faraday screen. When the inductor and the electrode are suitable cooled, for example by the circulation of water in a cooling circuit provided for this purpose, an intermediate polymer material, such as Teflon, can be used, otherwise use can advantageously be made of a ceramic foam, or a glass or alumina wool, as an intermediate material. This is because the latter have the advantage of resisting temperature and limiting the free spaces where the plasma could form through the proximity of the adjacent fibres.

Unfortunately, in increasing the space between the inductor and the electrode forming the Faraday screen, where the intermediate dielectric is placed, although the capacitive coupling reactance between these two electrodes is increased, the RF movement current towards the Faraday screen is not sufficiently reduced solely by this means. This is because, in increasing this space, the inducing current is also moved away from the induced current in the plasma, which, by increasing the inductive reactance, increases the amplitude of the RF voltage, which means an increase in the stray RF capacitive current that it is sought to decrease in the Faraday screen.

It is therefore recommended to block this RF stray current by placing a low-pass filter between the electrode forming the Faraday screen and the electrical supply connected thereto. In practice a filter allowing only the passage of frequencies below 1 MHz and preferably below 100 kHz is appropriate since it allows an alternating or pulsed excitation of the Faraday screen while blocking any RF current towards the generator connected to the Faraday screen, whereas the lowest-frequency signal of the generator connected to the Faraday screen towards the RF generator connected to the inductor is blocked by the high capacitive reactance created by the space between the inductor solenoid and the electrode forming the Faraday screen. The low-pass filter generally consists of a choke placed in series between the Faraday screen and its generator, and a capacitor connecting one of the ends of the choke to earth, but other equivalent configurations are also possible.

The device according to the invention is therefore distinguished from the prior art through the presence of an intermediate space sufficient to block a signal with a frequency equal to or less than high frequency towards the inductor coupled to the use of a low-pass filter intended to block the RF signal, and situated between the Faraday screen and the power supply thereof. In this space a plasma cannot form because of the presence of an intermediate dielectric material.

Earthed shielding can advantageously be provided for protecting all the treatment device, to enable it to be fixed mechanically in the vacuum chamber, to provide the fixing of slings for manipulation thereof during maintenance and cleaning necessary after each production campaign, but also to reduce the RF emission in the vacuum chamber. In this case, precautions must be taken to prevent the formation of any stray plasma between this shielding and the inductor on the one hand and the electrode forming the Faraday screen on the other hand, but also current losses through movement by RF capacitive coupling to earth. The stray currents are reduced by maintaining sufficient space, at least several millimetres, between the internal surface of the shielding and the external surface of the inductor solenoid and, if necessary, with the flanges of the Faraday screen.

To prevent the formation of any stray plasma, it is necessary to fill in the space between the shielding and the inductor and the Faraday screen with an intermediate dielectric material such as a polymer, a ceramic or glass, in the form of a solid material, a foam, or a fibrous material. Textiles made from glass fibre can also be used of course. The materials must be compatible with the temperature ranges envisaged and not excessively degassed during use in order not to contamination the substrate during treatment.

DESCRIPTION OF THE FIGURES

In the various figures, the same reference signs relate to similar or identical elements.

DETAILED DESCRIPTION OF THE INVENTION

Figure 1:
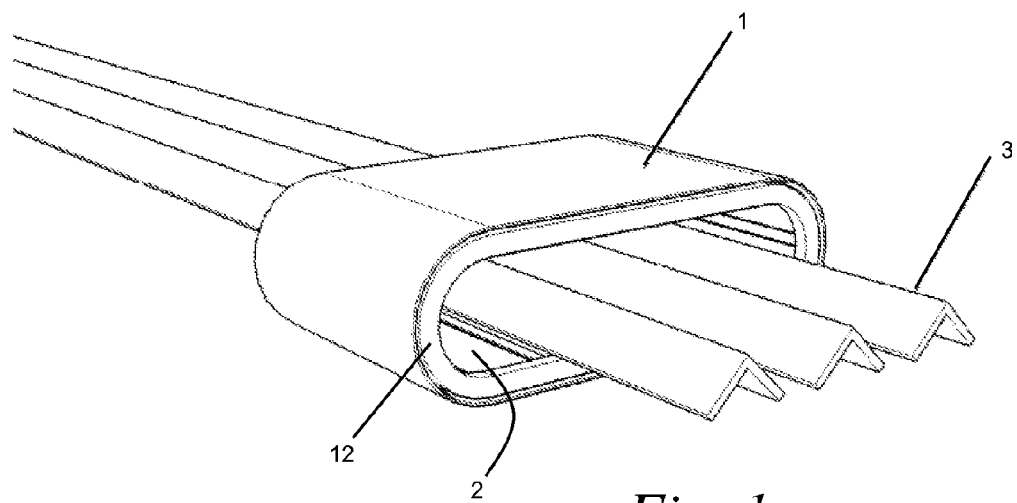
FIG. 1 is a schematic representation in perspective of a particular embodiment of the device according to the invention.
Figure 2:
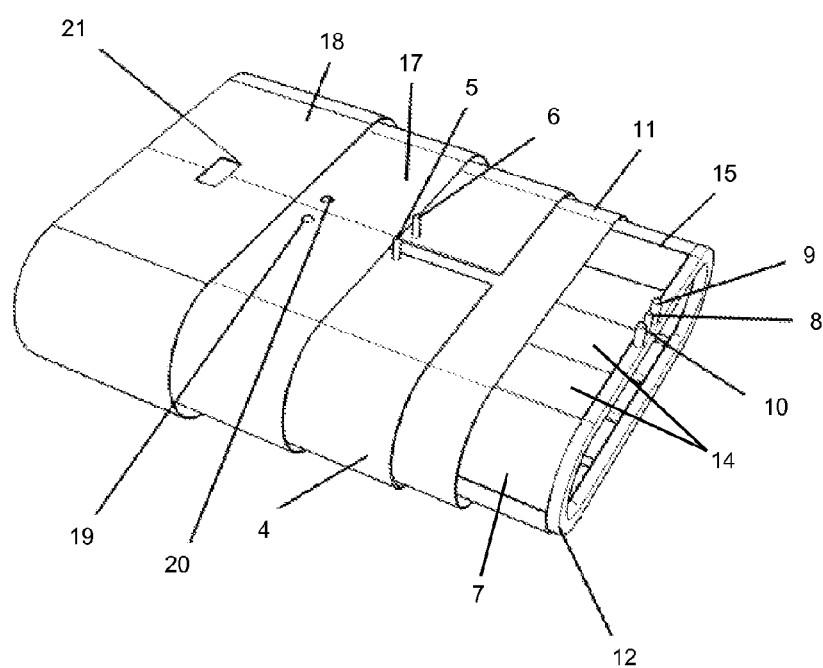
FIG. 2 shows an exploded view of the various elements making up the device shown in FIG. 1.
Figure 3:
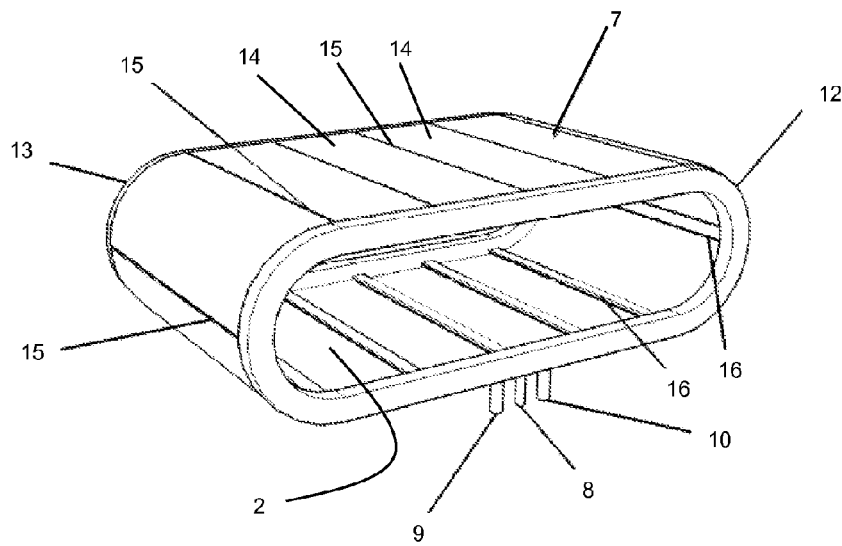
FIG. 3 is a perspective view of the electrode forming a Faraday screen of the embodiment of the invention shown in FIGS. 1 and 2.

1. The Device According to the Invention:

A device according to a particularly interesting embodiment of the invention is shown schematically in FIGS. 1 to 3. This device 1 is mounted in a vacuum chamber and comprises a treatment area 2 in which one or more metal substrates can travel substantially continuously. This treatment area 2 is situated inside the device.

In FIG. 1 a device is shown through which three metal girders 3 move, parallel to one another, in their longitudinal direction. The girders 3 are supported by banks of rollers, which are not shown in the figures, upstream and downstream of the treatment device.

The device has means for generating a plasma in the treatment area 2. These means comprise among other things an inductor 4 coupled to a radio-frequency generator for generating a plasma in the treatment area 2 by radio-frequency inductive coupling. The inductor 4, which at least partially surrounds the treatment area 2, is advantageously formed by a solenoid comprising a turn. This inductor 4 is connected to the radio-frequency generator (not shown) by connectors 5 and 6 provided for this purpose, via an impedance matching circuit, also not shown. One of the connectors 5 or 6 can be connected to the radio-frequency generator and the other one of the connectors 5 or 6 is then connected to earth. It is clear that other equivalent configurations, such as a push-pull configuration, reducing the radio-frequency voltage amplitude by a factor of two with respect to earth, are also possible.

An electrode forming a Faraday screen 7 is provided between the inductor 4 and the treatment area 2 where the plasma forms and protects the inductor from any contamination by the material emitted by the surface of the substrates. This electrode 7 is supplied with DC electric power, which can possibly be pulsed, or with high-frequency (HF) electrical power with a frequency below 1 MHz, according to the application sought. The electrode 7 has a connector 8 for being supplied with DC or HF power.

In order to be able to cool the electrode 7, the latter has a water circulation circuit supplied by a connector 9 and discharged by a connector 10.

The inductor 4 and the Faraday screen 7 are in the form of a sleeve enveloping the treatment area 2. The longitudinal axis of the sleeve corresponds substantially to the direction of travel of the substrates. The sleeve has an entry opening and an exit opening through which the substrate can enter the treatment area 2 and leave it.

As shown in FIG. 3, the electrode forming the Faraday screen 7 consists of a central part situated between two flanges 12 and 13. These flanges 12 and 13 are produced from an electrically conductive material and are annular in shape. The central part comprises a succession of strips 14 that are connected with their opposite ends respectively to the flanges 12 and 13. Between the strips 14 slots 15 are present. These slots 15 preferably extend parallel to the direction of travel of the substrates or, in other words, substantially parallel to the axis of the solenoid that constitutes the inductor 4. Thus these slots 15 are substantially perpendicular to the direction of flow of the inducing current in the inductor 4.

The slots 15 are protected by longitudinal members 16 placed inside the electrode forming the Faraday screen 7, in the treatment area 2, and supported by the flanges 12 and 13 of this electrode 7. A small distance is maintained between the longitudinal members 16 and the strips 14 so as not to short-circuit the slots 15 and so as to enable the electromagnetic field generated by the inductor 4 to extend as far as the treatment area 2. One of the flanges 12 is provided with the aforementioned connectors 9 and 10 for its water cooling circuit and with the connector 8 for the electrical polarising of the electrode 7 with respect to the substrate 3 by means of a DC or HF electrical power supply.

It is clear that the electrode forming the Faraday screen 7 is not necessarily formed by a succession of strips, but can also comprise a metal sheet provided with a succession of openings in the form of slots.

In a variant of the embodiment of the device described above, the flanges 12 and 13 can have at least one cutout so as not to form a closed circuit and contribute to the reduction in the amplitude of the currents that are possibly induced therein by the inductor 4.

The electrode forming a Faraday screen 7 is preferably covered with a dielectric material 11 before being introduced inside the inductor 4.

The inductor 4 is protected by an intermediate dielectric material 17 before being covered by shielding 18. The latter is generally electrically connected to earth. This shielding 18 has openings 19, 20 and 21 that enable the connectors 5 and 6 to pass. The shielding 18 can also, in some cases, be maintained at a floating potential by isolating it from earth by its fixing points in the vacuum chamber.

Figure 4:
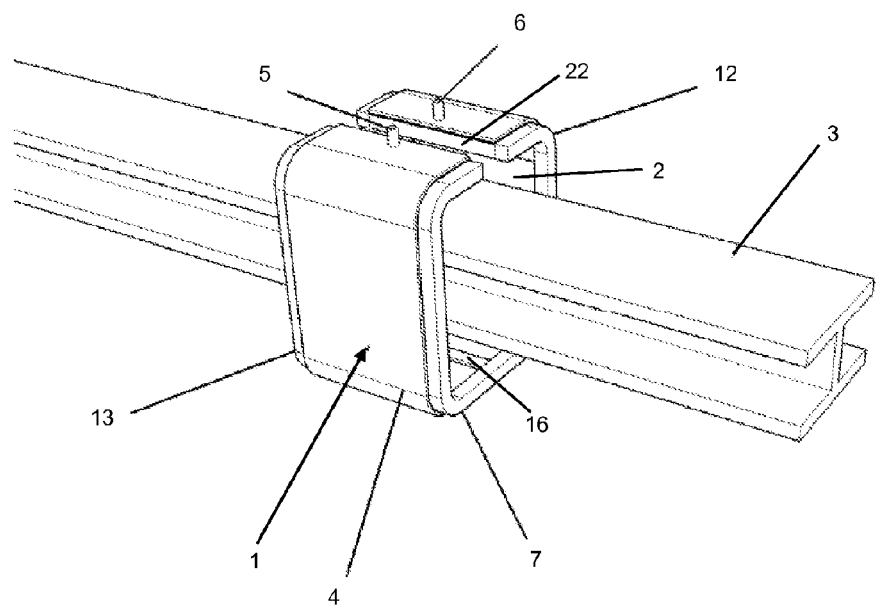
FIG. 4 is a schematic representation of another embodiment of the device according to the invention.

FIG. 4 is a schematic representation of a particular configuration of the device according to the invention. This configuration enables long products of high tonnage to be treated, such as beams 3 having an I-shaped cross section. The transverse section of the device 1 is adapted to the transverse section of the product 3. In this configuration the treatment device 1 comprises the inductor 4 and an electrode forming the Faraday screen 7, the flanges 12 and 13 of which emerge from the inductor 4 in order not to be the origin of induced electric currents. The intermediate dielectric material 17 and the shielding 18 are not shown in order to emphasise the active part of the device. The intermediate dielectric material 11 is not visible since it is situated between the inductor 4 and the electrode 7. The inductor 4 is supplied with RF power by connectors 5 and 6. An opening 22 is left in the top part of the treatment device 1, which if necessary makes it possible to transport the product to be treated by means of a support suspended under a monorail, not shown. This monorail moves outside the treatment area 2.

It is also possible to imagine a situation where the opening 22 is in the bottom part of the device 1. This enables the substrates to be transported through the treatment area 2 on carriages travelling on one or more rails. A downward-oriented opening 22 also makes it possible to recover debris detached from the contamination layer that accumulates on the electrode forming the Faraday screen 7 in a recovery vessel, not shown.

It is useful to emphasise that the inductor, which may, in one of its particularly advantageous forms, be formed by a solenoid comprising one or more turns, may generally have any geometry. This is because, the electromagnetic fields induced by the inductor being confined to the periphery of the plasma and in the vicinity of the electrode forming the Faraday screen protecting the inductor, the strength of the electromagnetic field is substantially independent of the general geometry of the device and any proximity of other independent devices. This may be taken advantage of in particular applications. For example, for treating a particular face of a substrate it would be possible to provide an inductor and an electrode forming a Faraday screen, the surface of which, with a similar shape, is substantially parallel to this face and in front of which the product would pass.

It is thus possible for example to treat independently by this method the two faces of a steel sheet passing in front of a flat device consisting of a flat inductor protected by its electrode forming a Faraday screen opposite to the face to be treated. This configuration, by turning over the sheet horizontally through 180°, would make it possible to treat the two faces of the sheet with the devices situated under the sheet, and the electrodes of which forming the Faraday screen could serve as vessels for recovering the contamination layer.

Another advantage of this modular design of the device is to be able to limit the reactance of the inductor by limiting the length travelled by the current, but also to divide the radio-frequency power over several inductors when large products are treated. If it is necessary for example to treat the complete body of a car, it is possible to design a system using four devices, where two devices have a width of 2 metres for treating the top and bottom faces of the bodywork and where two devices have a width of 1.5 metres for treating the lateral sides of the bodywork. This modular design also makes it possible to adapt the geometry of the devices to the treatment of the internal surfaces of some products, or to move the devices laterally, and therefore perpendicular to the direction of movement of the substrates treated, in order to adapt to the particular transverse dimensions of different substrates.

2. Operational Conditions and Particular Configurations of the Invention 2.1. Nature and Pressure of the Treatment Gases For cleaning metal products, in particular steels in the form of long products and flat products, the pressure of the gas present in the vacuum chamber is fixed at between 0.05 Pa and 5 Pa ($5\times10^{-4}$ mbar and $5\times10^{-2}$ mbar).

This gas is usually composed of 100% argon. In specific applications, the argon can be combined with oxygen, hydrogen, or possibly other rare gases such as for example He, Kr or Xe.

When the device according to the invention is used for heating products with, possibly, diffusion treatment of an element brought in the form of a gaseous molecule containing it, the treatment gas is in general argon, possibly mixed with gases containing the elements to be diffused at the surface of the treated product in the case of reactive treatment with the surface of the substrate. Such a gas could for example comprise hydrocarbon gases for the diffusion of carbon on the surface of a product, or organometallic gases for adding metals to this surface. The total pressure of the gas must in general be greater than 5 Pa in order to avoid the erosion of the surface of the substrate by sputtering and is preferably between 5 Pa and 100 Pa (between 0.05 mbar and 1 mbar).

2.2. Radio-Frequency Excitation of the Inductor

The inductor 4 is advantageously excited with an excitation frequency of between 1 MHz and 170 MHz and preferably between 1 and 30 MHz, in particular 13.56 MHz, according to the length travelled by the current in the inductor. The lowest frequencies are chosen for devices with large cross sections in order to reduce the impedance of the choke of the inductor. For this same reason, the inductor usually has only one turn, which also makes it possible to construct devices having an opening as described above and shown for example in FIG. 4. Thus this allows the use of transport devices suspended on a monorail or on carriages, and/or the removal of the contamination layer which would possibly be detached from the electrode forming the Faraday screen in a recovery vessel placed under the treatment device.

Preferentially the conventional frequency of 13.56 MHz is used, but frequencies of below 10 MHz and in particular between 2 MHz and 5 MHz are advantageous for plants where the length travelled by the current in the inductor exceeds 3 metres. The useful radio-frequency power per device varies according to the size of the device but will in general be greater than or equal to 5 kW. Typically this power is between 5 kW and 30 kW per inductor although lower or higher powers can be envisaged.

2.3. Excitation of the Electrode Forming the Faraday Screen

The electrode that forms the Faraday screen is polarised positively with respect to the substrate treated or a counter-electrode situated between the Faraday screen and the substrate. This substrate or this counter-electrode is generally, but not always, connected to the earth of the plant. The mean power over a polarising cycle, with respect to the potential of the substrate treated or of the counter-electrode, must be positive, that is to say the ratio between the integral of the voltage over a period to the period is positive. The polarising can therefore be DC, rectified AC, or AC polarised positively with respect to the substrate or the counter-electrode with any negative pulses.

The excitation frequency of the electrode forming the Faraday screen must be lower by at least a factor of 10 with respect to the radio-frequency coupled to the inductor. In practice this excitation frequency is less than 1 MHz and preferably less than 100 kHz. In the case of a DC current, this excitation frequency is in particular zero with possibly negative pulses.

An electrical supply is connected to the electrode forming the Faraday screen and the substrate or an electrode facing it. This supply is regulated for power proportionally to the area of the substrates facing the electrode forming the Faraday screen and moving in front of this electrode through the treatment area.

It is useful to mention that the power applied to the electrode forming the Faraday screen is preferably at least equal to the radio-frequency power applied to the inductor to enable the plasma to be created. This power applied to the electrode is advantageously greater than the radio-frequency power applied. In fact, the method is all the more economical, the higher the ratio of the power of the electrode forming the Faraday screen to the radio-frequency power coupled by the inductor. This point is important for metallurgical applications sought where the powers involved are considerable and the costs of investment and use of RF supplies much higher than those of supplies functioning at frequencies below 100 kHz.

2.4. Conditions to be Complied with by the Substrate Passing Through the Treatment Device The metal substrate that passes through the treatment device must have limited transverse dimensions so as not to be the origin of induced currents. To do this, the substrate must under no circumstances be in contact with and be sufficiently far away from the peripheral zone of the plasma constituting the origin of the current induced by the inductor. This peripheral zone of the plasma, which is generally around a centimetre thick, where essentially all the electron current induced in the plasma circulates and where the transfer of energy takes place between the induced electrical field and the electrons of the discharge by stochastic and collisional process, protects the substrate against the generation of any current induced on its surface. The role of this layer of induced current at the periphery of the plasma where therefore essentially all the induced electromagnetic (EM) field is situated, is essential since it makes it possible to obtain a negligible electromagnetic field in the treatment area at the point where the treated substrate passes. The plasma therefore provides an effective shielding to the propagation of the electromagnetic waves, the amplitude of which is very rapidly attenuated in the direction of the axis of the device. It is this physical feature that makes possible, in the device according to the invention, the treatment of conductive materials and in particular of ferromagnetic materials such as soft steel.

For this purpose, it is necessary (1) that there exists a plasma prior to the passage of the substrate through the treatment area, or (2) that an ignition plasma can be created by a means different from the inductor prior to the inductor being put under radio-frequency power, and (3), as already mentioned above, that the treated substrate passes sufficiently far from the peripheral zone of the plasma where essentially all the electron current induced in the plasma flows. In practice, any point on the surface of the substrate will not approach to less than 5 cm of the surface of the electrode forming the Faraday screen oriented towards the plasma. The induced electromagnetic field decreases exponentially as a function of the distance measured perpendicularly with respect to the surface of the plasma moving away from the inductor. At a distance of 5 cm, the attenuation of the amplitude of the signal is generally around 99% of its initial value.

Consequently the plasma is generated by radio-frequency induction in the vicinity of the surface of the inductor before the substrate or substrates to be treated pass in line with this inductor, or any device for generating an ignition plasma is provided to create a plasma before the radio-frequency power is coupled to the inductor when the substrate is already at least partially present in line with the inductor.

A device for capacitive ignition of the plasma, in the case where the radio-frequency supply comes to be cut during the treatment of a substrate, is particularly well suited to the application. It is advantageously possible to take advantage of the high voltage generated at the aforementioned connector 5 or 6 of the inductor when the latter is powered up, making use of an ignition electrode situated in the treatment area in the vicinity of the electrode forming the Faraday screen. This ignition electrode is connected to the aforementioned connector 5 or 6 to enable a capacitive ignition plasma to be created between this ignition electrode and the substrate, for example.

2.5. Use of Magnetic Mirrors

In order to reduce the plasma losses by ambipolar diffusion at the entry and exit openings situated at the aforementioned flanges 12 and 13 of the device according to the invention, use can be made of magnetic mirrors consisting of solenoids with an electric current passing through that is preferably a DC current. These two solenoids are advantageously situated so as to surround the flanges 12 and 13. A simple means consists of disposing around the shielding 18 two solenoids situated in line with the flanges 12 and 13. These solenoids are supplied with current by an independent electrical generator for creating a maximum magnetic induction field in line with each solenoid.

3. Examples of Practical Applications 3.1. Cleaning Device for Long Steel Products of Average Cross Section The device used is of the type shown in FIGS. 1 to 3. The treated product has a nominal total specific surface of 2 m$^2$/m. The main internal dimensions of the electrode forming the Faraday screen 7 are 1 m×0.3 m, with a useful axial length of 0.55 m. The electrode forming the Faraday screen 7 is cooled with water. The inductor solenoid 4 is made from copper and cooled with water, and its internal surface is situated at 2 cm from the external surface of the induced plasma.

The device is fixed in a vacuum chamber between two banks of rollers enabling the products 3 to be transported in the treatment area 2. The shielding 18 is maintained at earth. The vacuum chamber is supplied with argon at a pressure of 5×10$^{-3}$ mbar and a temperature of 300°K.

Under these conditions, a capacitive ignition device comprising an electrode connected to the connector 6 of the inductor 4 is used. Use is made of the earthed product 3 as a counter-electrode. After capacitive ignition of the plasma the plasma is maintained by induction via the inductor solenoid 4 while dissipating therein a useful electrical power of 15 kW at 13.56 MHz.

The electrode forming the Faraday screen 7 is connected to a DC current generator that maintains a power of 57 kW between the latter and the product, ensuring the cleaning of the surface of the product by ion bombardment at a voltage of 600 V. The inverse of the attenuation coefficient of the electromagnetic field at the periphery of the plasma is equal to 1.14 cm. Periphery of the plasma means the thickness of the skin of the plasma where essentially the induced current flows.

When the inductor of the device is excited not at 13.56 MHz but at 3.39 MHz, all other conditions being equal, the characteristics of the plasma are unchanged, but the impedance of the excitation circuit between the connectors 5 and 6 of the inductor 4 is lower.

3.2. Cleaning Device for Long Steel Products with a High Cross Section

The device used is of the type shown in FIG. 4 and is provided with shielding 18 and an intermediate dielectric material 17, neither shown in this material. The treated product has a nominal total specific surface of 3 m$^2$/m. The principal internal dimensions of the electrode forming the Faraday screen 7 are 0.8 m×0.9 m with a useful axial length of 0.5 m.

The electrode forming the Faraday screen 7 is cooled with water. The inductor solenoid 4 is made from copper and cooled with water and its internal surface is situated at 2 cm from the external surface of the induced plasma. The device is fixed in a vacuum chamber between two banks of rollers enabling the product 3 to be transported in the treatment area. The shielding 18 is earthed. The vacuum chamber is supplied with argon at a pressure of 5×10$^{-3}$ mbar and at a temperature of 300°K.

Under these conditions, a capacitive ignition device consisting of an electrode connected to the connector 6 and using the earthed product 3 as a counter-electrode, ignites a plasma, which is then maintained by induction via the inductor solenoid 4, dissipating therein a useful electrical power of 15 kW at 13.56 MHz. The electrode forming the Faraday screen 7 is connected to a DC generator, which maintains a power of 50 kW between the latter and the product, ensuring the cleaning of the surface of the product by ion bombardment at a voltage of 600 V. The inverse of the attenuation coefficient of the electromagnetic field at the periphery of the plasma is equal to 1.37 cm. Periphery of the plasma means the thickness of the skin of the plasma where the induced current essentially flows.

3.3. Device Adapted to the Cleaning of Steel Sheets Continuously

The device used is of the type shown in FIGS. 1 to 3. The treated product has a nominal total specific surface of 3 m$^2$/m. It is in particular a sheet 1.5 m wide. The principal internal dimensions of the electrode forming the Faraday screen 7 are 1.7 m×0.2 m with a useful axial length of 0.7 m. The electrode forming the Faraday screen 7 is cooled with water. The inductor solenoid 4 is made from copper and cooled with water and its internal surface is situated 2 cm from the external surface of the induced plasma. The device is fixed in a vacuum chamber so that the sheet moving vertically passes through it at its mid-plane. The shielding 18 is earthed. The vacuum chamber is supplied with argon at a pressure of 5×10$^{-3}$ mbar and at a temperature 300°K, Under these conditions, a capacitive ignition device comprising an electrode connected to the connector 6 of the inductor 4 is used. Using the earthed sheet as a counter-electrode, ignition of the plasma is obtained, which is then maintained by induction via the inductor solenoid 4, dissipating therein a useful electrical power of 25 kW at 13.56 MHz.

The electrode forming the Faraday screen 7 is connected to a DC generator, which maintains a power of 148 kW between the latter and the substrate, ensuring the cleaning of the surface of the substrate by ion bombardment at a voltage of 900 V. The inverse of the attenuation coefficient of the electromagnetic field at the periphery of the plasma, that is to say the thickness of the skin of the plasma where the induced current mainly flows, is equal to 1.2 cm under these operational conditions.

4. The Device According to the Invention Forming a Plasma Source or an Ion Source The principles of the invention also make it possible to create a plasma source or an ion source.

Figure 5:
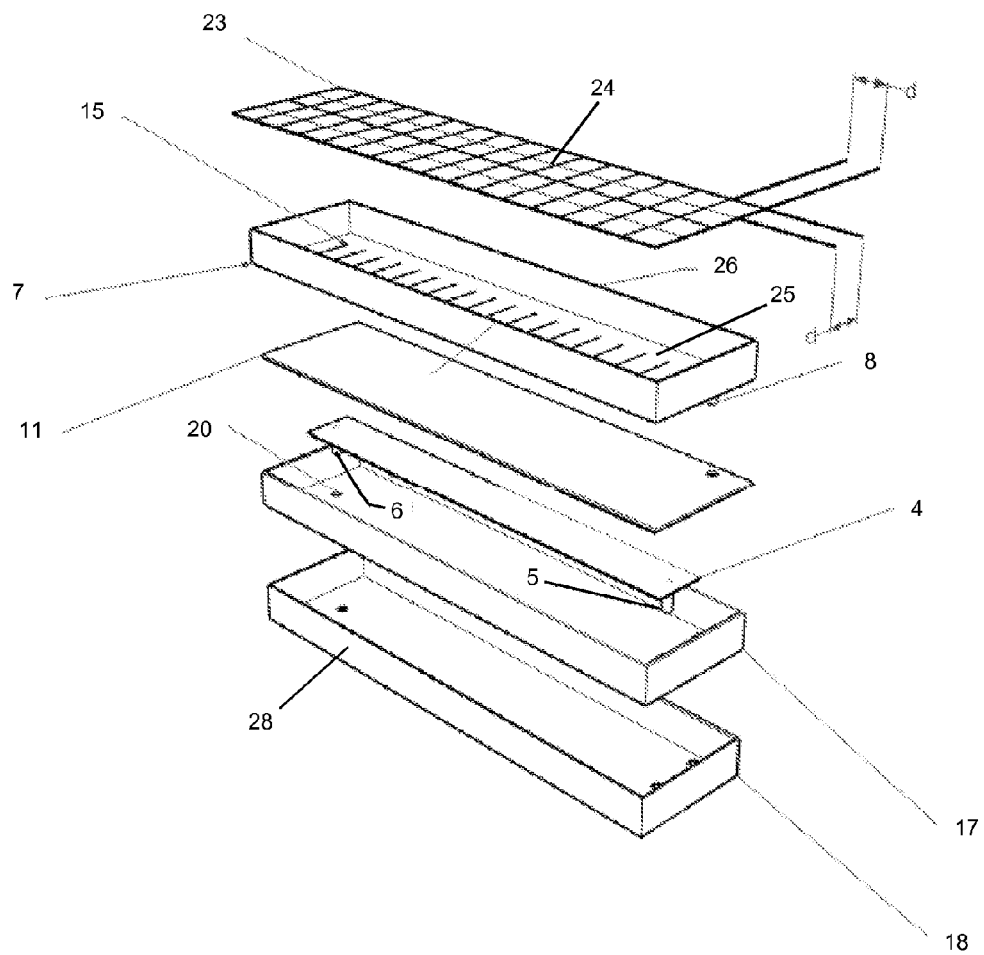
FIG. 5 shows an exploded view of an interesting embodiment of the device according to the invention for use of a plasma source.

FIG. 5 shows a particular configuration of the device according to the invention for using a plasma source. In this configuration, the production of a plasma the ions of which are accelerated at a given energy is done without having to polarise any substrate. This is because polarising is no longer established between an electrode forming the Faraday screen 7 and a conductive substrate, but indeed between the electrode 7 and a counter-electrode 23 in the form of a grille 24. The counter-electrode 23 has openings with a characteristic dimension "d". The characteristic dimension "d" of the openings formed in an extraction grille 24 is typically around the thickness of the sheath that forms naturally at the interface of the plasma and this counter-electrode 23 maintained at its extraction potential.

The optimum spacing of the openings in the grille 24 is around twice the thickness of the sheath corresponding to the plasma density produced by the inductor and to the on average positive polarising applied to the electrode forming the Faraday screen 7 with respect to this grille 24. This is because, under these conditions for the plasma source, the plasma cannot diffuse through the openings by definition and the field lines determining the path of the ions that then pass through these openings are predicted by the laws of electrostatics.

The electrode forming the Faraday screen 7 is in the form of a vessel with a bottom 25 and side walls 26. Slots 15 are provided in the bottom 25, extending parallel to one another and substantially perpendicular to the direction of flow of the inducing current in the inductor 4.

The extraction potential of the grille 24 is of course on average negative with respect to the potential of the electrode forming the Faraday screen 7, which is on average positive, according to the invention. This is because it is the potential of the electrode forming the Faraday screen 7 that is fixed with respect to the counter-electrode 23. The potential of the counter-electrode 23 can advantageously be that of earth. Under these conditions, the electrical field lines formed at the sheath of the plasma pass mainly through the grille 24 if the open proportion of the area of this grille 24 is high compared with its projected total surface. This can be achieved for example by using intersecting metal wires made of tungsten, molybdenum, steel or other material with a smaller dimension than the dimension "d" of the openings. Typically, the dimension of "d" is around 1 millimetre under normal conditions of use, and it is possible to use metal wires of a fraction of a millimetre to form the extraction grille 24.

In another embodiment of this particular form of the invention, the grille 24 can consist of parallel wires separated from one another by a distance "d".

This is because, when the potential of the electrode forming the Faraday screen 7 is on average +600 V with respect to the counter-electrode 24, with a plasma density at the limit of the sheath of around $2\times10^{11}$ cm$^{-3}$ in argon ions, a sheath thickness of 1.2 mm is typically observed. The grille 24 can advantageously be in electrical contact with the shielding 18, which is if necessary connected to earth.

Under these conditions, the ions, which follow the field lines, pass through the openings in the extraction grille 24 with a kinetic energy determined by the potential of the sheath formed between the plasma and this grille 24, itself determined by the potential fixed at the electrode forming the Faraday screen 7 with respect to the counter-electrode 23. In the previous example, the ions are extracted from the source with an energy of around 600 eV.

In order to prevent the formation of a positive space charge, the flow of ions is generally neutralised by a flow of electrons generated by an independent source of electrons. A more elegant and less expensive means consists of using a pulsed electrical supply in order to polarise the electrode forming the Faraday screen 7. This is because, under these conditions, by imposing negative pulses of short duration but repeated on the electrode forming the Faraday screen 7, the electrons are enabled to escape through the openings in the grille, which is positive by pulse with respect to the electrode forming the Faraday screen 7, and to electrically neutralise the flow of ions.

This is therefore indeed a plasma source. The duration of the negative pulses compared with that of the positive polarising may remain very low. The same applies to the absolute value of the negative pulse potential. It can remain low compared with the value of the positive potential, given that the mobility of the electrons is very much greater than that of the ions.

Slots 15 are produced in the electrode forming the Faraday screen 7. These slots 15 can of course be protected by longitudinal members 16 not shown in FIG. 5 and fixed to the walls 26 of the electrode 7. These walls 26 are equivalent to the flanges 12 and 13 shown in FIGS. 1 to 4.

The geometry of the plasma source is in no way limited to the plane geometry of FIG. 5. This is because this geometry may be that of a closed structure as shown in FIGS. 1 to 4. In this particular case of geometric configuration, the extraction grille 24 must have a geometry similar to that of the electrode forming the Faraday screen 7 and placed above the walls 26 so as to be electrically insulated from the potential of the Faraday screen 7.

Figure 6:
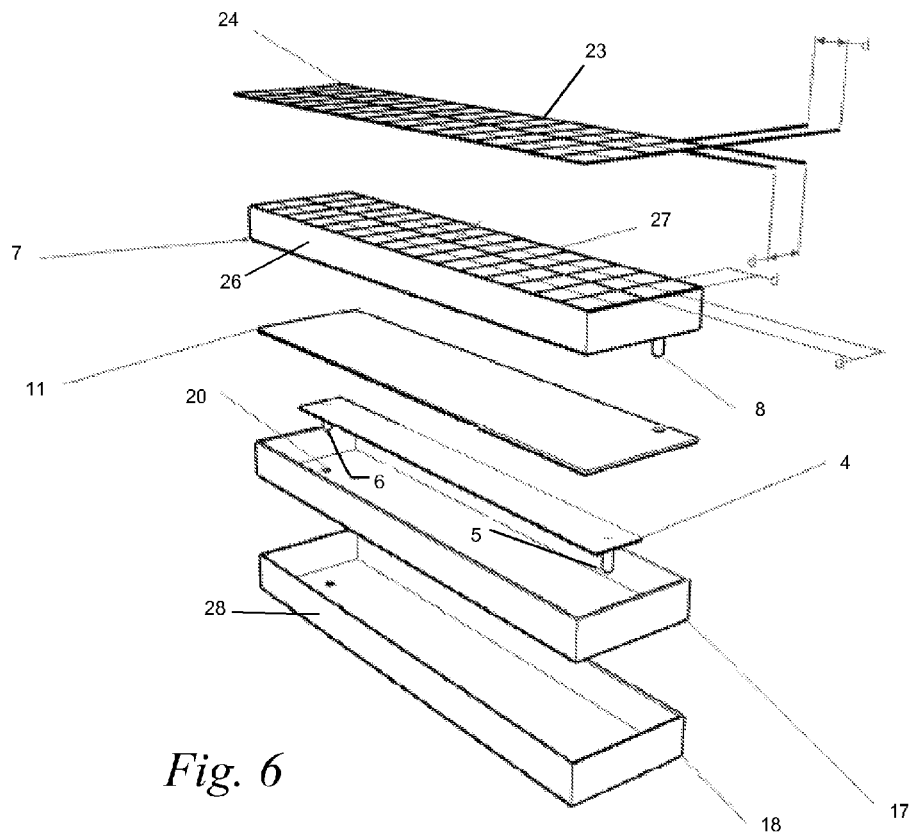
FIG. 6 shows an exploded view of an interesting embodiment of the device according to the invention for use of an ion source.

In FIG. 6 an embodiment of the device according to the invention is shown for the use of an ion source.

In this case, the electrode forming the Faraday screen 7 is closed by means of an exit grille 27 put to the same potential as that of the electrode forming the Faraday screen 7. The extraction grille 24 forming the counter-electrode 23, which is at an on average negative potential with respect to that of the exit grille 27, which is on average positive, must be placed at a distance of around "d" facing the ion exit grille 27. Under these conditions, based on the well known methods of ion sources, it is possible to optimise the geometry of the openings in the grilles so that the electrical field lines starting from the plasma and passing through the two grilles are such that the ions do not bombard the grilles and do not erode them. The ions are then essentially accelerated in the gap "d" separating the grilles 27 and 24. This is for example described in detail in "The Physics and Technology of Ion Sources" by Ian G. Brown, John Wiley & Sons ISBN 0471857084 (1989).

As mentioned in the case of a plasma source above, the flow of ions can be neutralised by an independent source of electrons of the invention, not shown in FIG. 6. However, it is also particularly advantageous to make use of a pulsed electrical supply to polarise the electrode forming the Faraday screen 7 so that, at each negative pulse applied to this electrode 7 and to the grille 27, electrons can escape from the plasma volume situated between the latter two and, after acceleration between the two grilles 27 and 24, pass through the extraction grille 24 in order to neutralise the flow of ions emitted during the major part of the polarising cycle of the electrode forming the faraday screen 7.

Screening 18 formed by a vessel 28 with a shape similar to that of the electrode forming the Faraday screen 7 surrounds the latter. A dielectric material 11 is present between the electrode forming the Faraday screen 7 and the inductor 14. The internal surface of the vessel 28 forming the shielding 18 is coated with a dielectric material 17. The electrode forming the Faraday screen 7 together with the inductor 4 is housed in the shielding 18.

The electrode forming the Faraday screen 7 is polarised on average positively with respect to the extraction grille 24. The latter can be electrically insulated with respect to the shielding 18 but is in general at the potential of this shielding 18. The potential of the extraction grille 24 is advantageously that of earth, but not necessarily.

In the case of an ion source, the system may also comprises three electrodes: the exit grille 27, the extraction grille 24 and a complementary electrode situated between these two grilles 27 and 24, closer to the extraction grille 24 than the exit grille 27, and at a potential slightly more negative that the extraction grille 24 serving to prevent the return of electrons to the exit grille 27 when these electrons are produced by a source independent of the device. This independent source of electrons may be a hollow cathode emitting electrons or a filament emitting electrons. The geometry and the relative positions of the openings in the different electrodes formed by the grilles are based on the contours of the so-called Pierce equipotentials (cf. "The Physics and Technology of Ion Sources" par Ian G. Brown, John Wiley & Sons ISBN 0471857084 (1989), p. 28).

Figure 7:
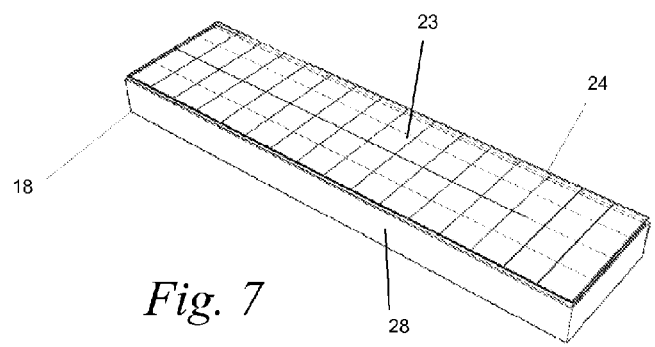
FIG. 7 shows the plasma source or the ion source, according to the invention, when this is assembled.

FIG. 7 shows the assembly of the constituent parts shown in the exploded representation in FIG. 5 or 6.

It is clear that the mesh of the grilles 24 and 27 and the distance "d" indicated in FIGS. 5 and 7 are not to scale, for reasons of legibility of the drawing.

An injection of gas in the vicinity of the electrode forming the Faraday screen 7, not shown in the figures, is always necessary, and especially in the case of plasma and ion sources, since it is necessary to compensate for the loss of gas associated with the emerging flow of ions from the source.

The plasma or ion sources described above have the advantage of having very great simplicity of construction and resistance to the contamination coming from the products that are being treated.

In addition, the plasma is produced economically in an inductive fashion and acceleration of the ions is also achieved economically by means of a DC electrical source, possibly pulsed. Thus a source of plasma or ions with a high energy efficiency is produced.

It is possible to produce sources for any geometries and, in particular, plane geometries with large dimensions, for example up to 3 m long, for example for the pretreatment of architectural glass before vacuum coating.

The plasma source can be used for cleaning architectural glass. In this case, the device used is a plasma source of the type shown in FIG. 5 and adapted for the cleaning of glass plates 3 m wide before coating by sputtering. The device is supplied with argon and produces an argon plasma the ions of which are extracted at an energy of around 300 eV by relative polarising of the extraction grille 24 with respect to the electrode forming the Faraday screen 7 by means of a pulsed DC supply. The potential of the electrode forming the Faraday screen 7 is +300V with respect to earth and the extraction grille 24 is at the potential of the earthed shielding 18. The power consumed is around 15 kW in pulsed DC current for 5 kW in radio frequency at 13.56 MHz.

The invention claimed is:

1. A method for the plasma treatment of metal or insulating substrates, said method comprising:
    passing at least one substrate substantially continuously through a vacuum chamber having a treatment area (2), the at least one substrate passing through said treatment area (2);
    maintaining the plasma by radio-frequency inductive coupling in the treatment area (2) by means of an inductor (4) connected to a radio-frequency generator;
    protecting the inductor (4) from any contamination by the material emitted by the surface of the substrate (3) by positioning a Faraday screen (7) between the plasma and the inductor (4) and directly adjacent to the plasma, wherein the Faraday screen (7) constitutes a conductive electrode;
    electrically polarizing the Faraday screen (7) on average positively with respect to the substrate (3), thereby accelerating ions present in the plasma towards the substrate (3);
    generating the plasma between the Faraday screen and the substrates in the treatment area; and
    recovering electrons from the plasma at the electrode forming the Faraday screen (7), the plasma being generated between the Faraday screen and the substrates in the treatment area.

2. The method according to claim 1, further comprising subjecting the Faraday screen (7) to a succession of polarising cycles comprising negative pulses.

3. The method according to claim 1, further comprising providing an excitation frequency of the Faraday screen (7) lower by at least a factor of 10 with respect to the frequency of the radio-frequency generator coupled to the inductor (4) and in particular less than 1 MHz.

4. The method according to claim 1, wherein the step of polarizing comprises polarizing the Faraday screen (7) on average positively with respect to the substrate (3), and the method further comprises connecting the electrical supply to the Faraday screen (7) between the screen (7) and the substrate (3) and regulating the electrical supply for power proportionally to the area of the substrate (3) moving in front of the Faraday screen (7) in the treatment area (2).

5. The method according to claim 1, wherein a minimum distance of 2 cm, and preferably 5 cm, is maintained between the Faraday screen (7) and the surface of the substrate (3).

6. The method according to claim 1, wherein the step of generating the plasma in the treatment area (2) is performed prior to a step of powering up the inductor (4) by the radio-frequency generator.

7. The method according to claim 1, further comprising generating a magnetic field at the point where the substrate (3) enters and/or leaves the treatment area (2) to confine the plasma in the treatment area (2).

8. The method according to claim 1, further comprising applying the electrical power between the Faraday screen (7) and the substrate (3) at an amount at least equal to the radio-frequency power serving to create the plasma.

9. The method according to claim 1, further comprising allowing transmission of the electromagnetic power of the inductor (4) to the plasma through the Faraday screen (7) by the presence of a series of slots (15) substantially parallel to one another and substantially perpendicular to the direction of flow of the inducing current in the inductor (4).

10. A device for the treatment of metal or insulating substrates by plasma, comprising:
    a vacuum chamber having a treatment area (2) in which a metal or insulating substrate can pass substantially continuously,
    an inductor (4), connected to a radio-frequency generator to generate a plasma in the treatment area (2), and
    a Faraday screen (7) directly adjacent to the plasma and positioned between the plasma and the inductor (4) for protecting the inductor (4) from any contamination by material emitted by the surface of the substrates, wherein the plasma is generated in the treatment area (2), wherein the Faraday screen (7) constitutes a conductive electrode and is electrically polarised on average positively with respect to the substrates (3), and wherein the Faraday screen (7) is arranged so that the plasma is generated between the Faraday screen (7) and the substrate (3) in the treatment area (2).

11. The device according to claim 10, wherein at an intermediate space is provided between the inductor (4) and the Faraday screen (7), the intermediate space being filled in with a dielectric material (11).

12. The device according to claim 11, wherein the distance between the inductor (4) and the Faraday screen (7) is between 0.1 and 10 CM.

13. The device according to claim 11, wherein the intermediate dielectric material (11) comprises a polymer, Teflon, a ceramic foam or glass or alumina wool.

14. The device according to claim 10, wherein a low-pass filter is provided between the Faraday screen (7) and the electrical supply to this screen (7), allowing only the passage of frequencies below 1 MHz and preferably below 100 kHz.

15. The device according to claim 10, wherein the Faraday screen (7) has a series of slots (15) substantially parallel to one another and substantially perpendicular to the direction of flow of the inducing current in the inductor (4).

16. The device according to claim 15, wherein longitudinal members (16) are positioned at a short distance from the slots (15) opposite the latter on the plasma side.

17. The device according to claim 10, wherein a shielding (18), connected to earth and maintained at a floating potential, is provided which surrounds the inductor (4).

18. The device according to claim 15, wherein an intermediate space is present between the inductor (4) and the shielding (18) that is filled in with a dielectric material (17).

19. The device according to claim 10, wherein the inductor (4) comprises at least one induction turn.

20. The device according to claim 10, wherein the inductor (4) is excited at a frequency of between 1 and 170 MHz.

21. The device according to claim 10, wherein the supply to the Faraday screen (7) has an excitation frequency that is no more than one tenth of the frequency coupled to the inductor (4).

22. The device according to claim 10, wherein means are provided for enabling an ignition plasma to be created.

23. The device according to claim 10, wherein the inductor (4) and the Faraday screen (7) are in the form of a sleeve enveloping the treatment area (2) and the longitudinal axis of which corresponds substantially to the direction of travel of the substrates (3), the sleeve forming the Faraday screen being disposed inside the sleeve forming the inductor, and the sleeve forming the Faraday screen having an entry opening and an exit opening through which the substrate (3) can enter the treatment area (2) and leave the treatment area.

24. The device according to claim 23, wherein said sleeves each have an opening extending all along its longitudinal direction.

25. A method for the plasma treatment of metal or insulating substrates, said method comprising:

passing at least one substrate substantially continuously through a vacuum chamber having a treatment area (2), the at least one substrate passing through said treatment area (2);

maintaining the plasma by radio-frequency inductive coupling in the treatment area (2) by means of an inductor (4) connected to a radio-frequency generator;

protecting the inductor (4) from any contamination by the material emitted by the surface of the substrate (3) by positioning a Faraday screen (7) between the plasma and the inductor (4) and directly adjacent to the plasma, wherein the Faraday screen (7) constitutes a conductive electrode;

electrically polarizing the Faraday screen (7) on average positively with respect to a counter-electrode (23) present in the plasma, thereby accelerating ions present in the plasma towards the counter-electrode (23);

generating the plasma between the Faraday screen and said counter-electrode; and recovering electrons from the plasma at the electrode forming the Faraday screen (7), the plasma being generated between the Faraday screen and said counter-electrode.

26. The method according to claim 25, wherein a minimum distance of 2 cm, and preferably 5 cm, is maintained between the Faraday screen (7) and the surface of the counter-electrode.

27. A device for the treatment of metal or insulating substrates by plasma, comprising:

a vacuum chamber having a treatment area (2) in which a metal or insulating substrate can pass substantially continuously, an inductor (4), connected to a radio-frequency generator to generate a plasma in the treatment area (2), a counter-electrode (23), a Faraday screen (7) directly adjacent to the plasma and positioned between the plasma and the inductor (4) for protecting the inductor (4) from any contamination by material emitted by the surface of the substrates, wherein the plasma is generated in the space present between the Faraday screen and the counter-electrode (23), wherein the Faraday screen (7) constitutes a conductive electrode and is electrically polarised on average positively with respect to the counter-electrode (23), and wherein the Faraday screen (7) is arranged so that the plasma is generated between the Faraday screen (7) and said counter-electrode (23).

28. The device according to claim 25, wherein the counter-electrode (23) having openings or slots with a width (d) of around the thickness of the sheath formed by the interface of the plasma and this counter-electrode (23), is provided opposite the electrode forming the Faraday screen (7), the latter being electrically polarised on average positively with respect to the counter-electrode (23), so as to constitute a plasma source or an ion source.

29. The device according to claim 28, wherein an exit grille (27) is present between the electrode forming the Faraday screen (7) and said counter electrode, this exit grille (27) being put at the same potential as the Faraday screen (7) and being positioned facing the counter-electrode (23) at a sufficiently short distance therefrom so that no plasma can exist between the exit grille (27) and said counter-electrode (23).

* * * * *